United States Patent [19]
Kim et al.

[11] Patent Number: 5,959,907
[45] Date of Patent: Sep. 28, 1999

[54] SEMICONDUCTOR MEMORY DEVICE HAVING A REDUNDANCY CIRCUIT

[75] Inventors: Du-Eung Kim; Choong-Keun Kwak, both of Suwon, Rep. of Korea

[73] Assignee: Samsung Electronics, Co., Ltd., Suwon, Rep. of Korea

[21] Appl. No.: 09/028,150

[22] Filed: Feb. 23, 1998

[30]     Foreign Application Priority Data

Feb. 22, 1997 [KR]   Rep. of Korea ......................... 97-5457

[51] Int. Cl.⁶ ................................. G11C 7/00; G11C 8/00
[52] U.S. Cl. .................. 365/200; 365/225.7; 365/230.06
[58] Field of Search ................................. 365/200, 225.7, 365/226, 227, 229, 230.06

[56]         References Cited

U.S. PATENT DOCUMENTS 5,373,471  12/1994  Saeki et al. ............................. 365/200
5,469,391  11/1995  Haraguchi ............................... 365/200
5,808,948   9/1998  Kim et al. ............................... 365/200

*Primary Examiner*—Trong Phan
*Attorney, Agent, or Firm*—Marger Johnson & McCollom, P.C.

[57]          ABSTRACT

A redundancy circuit for a semiconductor device comprises a circuit having variable impedance changed in accordance with a chip selecting signal. The variable impedance circuit has a low impedance when the chip selecting signal is at a low level and a high impedance when the chip selecting signal is at a high level. Therefore, when the device is in a standby state, no static current flows, and when the chip is in an active state current of less than several micro amperes flows. Thus, the power dissipation of the redundancy circuit can be reduced.

7 Claims, 2 Drawing Sheets

SEMICONDUCTOR MEMORY DEVICE HAVING A REDUNDANCY CIRCUIT

This application corresponds to Korean patent application No. 97-5457 filed Feb. 22, 1997 in the name of Samsung Electronics Co., Ltd.

BACKGROUND OF THE INVENTION

1. Field of the Invention

The present invention relates to a semiconductor memory device and, more particularly, to a redundancy circuit for remedying defective memory cells created during fabrication of a semiconductor memory device.

2. Description of the Related Art

In fabrication of semiconductor memory devices, it is very important to obtain a higher yield. Generally, if a fabricated semiconductor memory device has several defective memory cells, or even only one defective cell, it may be unusable as a memory device. Highly integrated semiconductor memory devices have many more defective memory cells than devices manufactured at a lower level of integration. Therefore, as the integration level of semiconductor memory devices increases, the increased number of defective cells causes the yield to fall.

The use of a redundancy circuit is a well-known technique for obtaining a desired yield rate when manufacturing semiconductor memory devices. A semiconductor device fabricated with this technique includes, in addition to a main memory cell array for storing binary data, a redundant memory cell array for replacing defective memory cells on in the rows/columns of the main memory with redundant memory cells. Redundant memory cells are connected to respective redundant word lines and bit lines. If fewer that several thousand defected memory cells are detected by testing the main memory cell array, they can be replaced with redundant memory cells. As a result, the memory chip can be fabricated as a non-defective article.

A redundant cell array which is arranged to replace defective memory cells on rows of the main memory cell array with redundant memory cells is called a row redundancy array. A redundant cell array which is arranged to replace defective cells on columns of the main memory cell array with redundant memory cells is called a column redundancy array. To replace the defective cells with the redundant cells, a redundancy circuit is required. A redundancy circuit includes: a circuit for storing location information for the defective cells, namely, repair addresses; a circuit for determining whether the repair addresses are identical with externally applied addresses; and the redundancy cell array.

A row redundancy circuit decodes row addresses received therein, and operates to replace defective regions with row regions corresponding to the redundant cell array when the row addresses are identical with the stored repair row addresses. Similarly, a column redundancy circuit operates to replace defective column regions of the main memory cell array with column regions corresponding to the redundant cell array by comparing the column addresses with the stored repair column addresses.

A redundancy decoder circuit stores repair addresses and determines whether row or column addresses are identical with the repair addresses. A redundancy decoder circuit has a row/column address buffer, a redundant row/column predecoder circuit, and a redundant row/column decoder circuit. The redundant row/column predecoder circuit has a plurality of redundant predecoders and the redundant row/column decoder circuit has a plurality of redundant decoders.

Each redundant row/column predecoder receives a row/column address signal RA0–RAi from the row/column address buffer and generates a redundancy enable signal for enabling the redundant decoders to be activated. The redundancy circuit is also activated by the redundancy enable signal. As well known in the art, the redundant decoder circuit in the row redundant circuit drives redundant word lines and the redundant circuit in the column redundant circuit drives column selection lines for selecting redundant bit line pairs.

Each of the redundant row/column predecoders has a plurality of fuses. In a semiconductor memory device with a redundant row/column predecoder, fuses are cut when there are defective cells that must be remedied.

As the integration level of semiconductor memory devices increases, the devices must be designed to operate with minimized active or standby power dissipation. However, in a semiconductor memory device with the above mentioned redundant predecoder, a constant amount of current (i.e., static current) always flows through the fuse during an active or standby state when a fuse is not cut. As a result, in a conventional semiconductor memory device, a constant amount of power is dissipated in relation to the operation characteristics of the redundancy circuit.

SUMMARY OF THE INVENTION

It is an object of the present invention to provide a semiconductor memory device having a redundancy circuit with reduced power dissipation therein.

It is another object of the present invention to provide a redundancy circuit for reducing power dissipation of a semiconductor memory device during a standby state.

According to an aspect of the present invention, a semiconductor memory device is provided with a redundancy circuit for replacing a defective cell with a redundant cell. The semiconductor memory device comprises a first node for receiving a chip selecting signal; a second node; a first inverter having an input terminal connected to the first node; a fuse connected between the first and the second node; a first current path connected between the second node and a ground, wherein current of less than several micro amperes flows through the first current path; and a second inverter having an input terminal connected to the second node. The device further comprises means having a circuit for storing a repair address used to replace the defective cell with the redundant cell and an address input terminal for receiving a row/column address for generating a redundant predecoding signal indicating whether the row/column address is identical with the repair address; and means having a plurality of input terminals for receiving the chip selecting signal, an output signal of the second inverter and the redundant predecoding signals, respectively, for generating a redundancy enable signal in accordance with logical combination of the signals applied through the input terminals. The redundancy circuit is activated in accordance with the redundancy enable signal.

In the semiconductor memory device, the means for generating the redundant predecoding signals comprises: a plurality of fuse pairs, each having two fuses wherein a first end of each of the two fuses is commonly connected to a corresponding input terminal of the means for generating the redundancy enable signal; a plurality of transmission gates, each connected between a second end of a first one of the two fuses and a corresponding address input terminal; each of the transmission gates operating responsive to at least one of the input and output signals of the second inverter, for transferring the row/column address corresponding to the address input terminal to the fuse that is connected to a corresponding transmission gate; and a plurality of dual inverters, each connected between a second end of a second one of the two fuses and the corresponding address input terminal and controlled by the chip selecting signal.

According to another aspect of the present invention, a semiconductor memory device with a redundancy circuit for replacing a defective cell with a redundant cell comprises: a first inverter having an input terminal for receiving a chip selecting signal; a fuse having a first terminal for receiving the chip selecting signal and a second terminal; a variable impedance means connected between the second terminal of the fuse and a ground, having a variable impedance that changes according to the chip selecting signal; wherein the variable impedance means provides a first voltage to the second terminal of the fuse when the chip selecting signal is inactivated, and provides a second level voltage to the second terminal of the fuse when the chip selecting signal is activated; a second inverter having an input terminal connected to the second terminal of the fuse; means, having a circuit for storing a repair address used to remedy the defective cell and having an input terminal for receiving a row/column address, for generating a redundant predecoding signal indicating whether the row/column address is identical to the repair address; and means for receiving the chip selecting signal, an output signal of the second inverter, and the redundant predecoding signal, for generating a redundancy enable signal according to a logical combination of the signals received, wherein the redundancy circuit is activated in response to the redundancy enable signal.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components.

DETAILED DESCRIPTION

It should be understood that the description of this preferred embodiment is merely illustrative and that it should not be taken in a limiting sense. In the following detailed description, several specific details are set forth in order to provide a thorough understanding of the present invention. However, the present invention may be practiced without these specific details.

Figure 1:
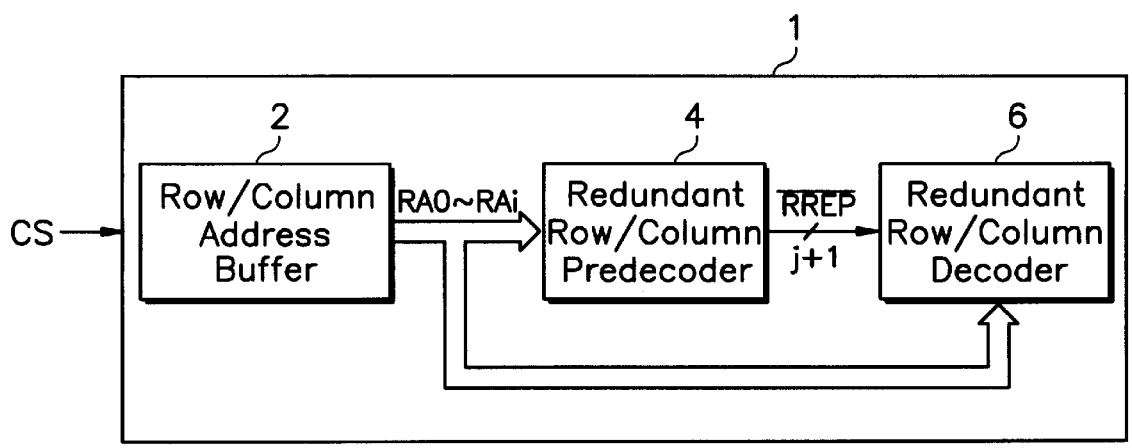
FIG. 1 is a block diagram showing a redundancy circuit of a semiconductor memory device according to the present invention.

Referring to FIG. 1, for a semiconductor memory device to which a chip selecting signal is applied, there is illustrated a redundancy decoder circuit for storing repair addresses and identifying whether row/column addresses are identical with repair addresses, along with peripheral circuits thereof. As described above, although not shown in the figure, a redundant row/column predecoder 4 and a redundant row/column decoder 6 include a plurality (e.g., j+1) of redundant predecoders and a plurality (e.g., j+1) of redundant decoders, respectively.

Figure 2:
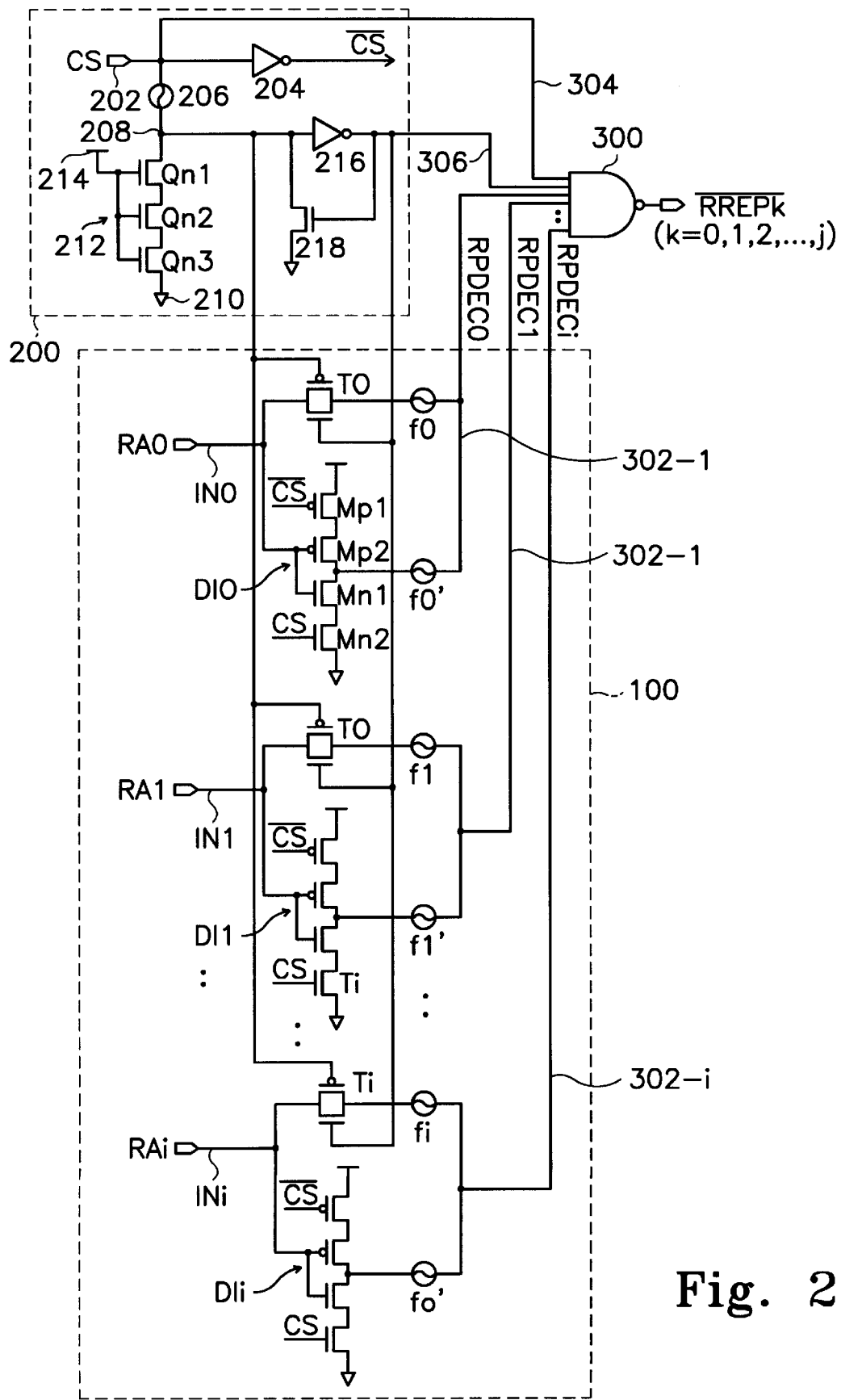
FIG. 2 is a circuit diagram showing a novel redundancy predecoder circuit of the redundancy circuit shown in FIG. 1.

The predecoders of the redundant predecoder circuit 4 receives row/column address signals RA0, RA1, RA2, . . . RAi from row/column address buffer 2, and generates redundancy enable signals $\overline{RREP0}$, $\overline{RREP1}$, $\overline{RREP2}$, . . . $\overline{RREPi}$ for activating the redundant decoders of the redundant row/column decoder circuit 6, respectively. The redundancy circuit is activated by the redundancy enable signals $\overline{RREP0}$–$\overline{RREPi}$. The redundant decoder circuit 6, as is well known, drives a plurality of redundant word lines in a row redundant circuit, and it also drives a plurality of column selection lines for selecting a plurality of redundant bit line pairs in a column redundant circuit. Each redundant predecoder includes a plurality of fuses. In a semiconductor memory device having such a redundant predecoder, fuses are cut when defective cells need to be remedied, but the fuses are not cut when defective cells, do not need to be remedied. FIG. 2 shows a detailed circuit of each predecoder of the redundant row/column predecoder circuit according to an embodiment of present invention. Referring to FIG. 2, each redundant row/column predecoder comprises a defective cell predecoder circuit 100, a redundant drive circuit 200, and a NAND gate circuit 300.

The defective cell predecoder circuit 100 includes a plurality of address input terminals IN0, IN1, . . . INi for receiving a plurality of row/column addresses from an address buffer 2, a plurality of fuses f0, f0', f1, f1', . . . fi, fi', a plurality of CMOS transmission gates T0, T1, . . . Ti, and a plurality of dual inverters DI0, DI1, . . . DIi. The fuses are arranged in pairs wherein one of each of f0, f1, . . . fi is paired with one of each of f0', f1', . . . fi'. One end of each of the respective fuse pairs (f0, f0'), (f1, f1'), . . . (fi, fi') is commonly connected to a corresponding input terminal 302–x(where, x=0, 1, 2, . . . i) of the NAND gate 300. Each CMOS transmission gate T0, T1, . . . Ti includes a p-MOSFET and an n-MOSFET. Each dual inverter DI0, DI1, . . . DIi includes two p-MOSFETs Mp1 and Mp2 and two n-MOSFETS Mn1 and Mn2. In the dual inverters DI0, DI1, . . . DIi, the source-drain channels of FETs Mp1, Mp2, Mn1 and Mn2 are connected in series between a power supply node VDD and a ground VSS. The source-drain channels of the FETs constituting the CMOS transmission gate T0 are connected between the other end of one fuse (e.g., fo) of each fuse pair (e.g., f0 and f0') and the corresponding address input terminal IN0. An input terminal (i.e., the gates of the FETs Mp2 and Mn1 ) and an output terminal (i.e., the junction node of the drains of the FETs Mp2 and Mn1) of dual inverter DI0 are connected to the address input terminal IN0 and the other end of one fuse (f0') of the fuse pair (f0 and f0'), respectively.

The redundant drive circuit 200 comprises a fuse 206, a MOS stack 212, two inverters 204 and 216, and n-MOSFET 218. The chip selecting signal CS is applied to a node 202 which is connected to one input terminal of the NAND gate 300. A node 208 is commonly connected to the drain of n-MOSFET Qn1, the input terminal of inverter 216, the gates of p-MOSFETs within the transmission gates T0, T1, . . . Ti, and the drain of n-MOSFET 218. One end of the fuse 206 is connected to the node 202 and the other end thereof is connected to the node 208. The MOS stack 212 includes three MOSFETs Qn1, Qn2 and Qn3. The drain-source channels of the FETs Qn1, Qn2 and Qn3 are connected in series between the node 208 and the ground 210, and the gates thereof are commonly connected to power supply voltage 214. The FETs Qn1, Qn2 and Qn3 have a conductance which allows a current of less than only one micro ampere to flow through their current path formed by their source-drain channels when a high level voltage (i.e., VDD)

is applied to the node 208 which is connected to one end of the current path. The output terminal of the inverter 204 is connected to the gate of the p-MOSFET Mp1 within each dual inverter. The output terminal of the inverter 216 is commonly connected to the input terminal 306 of the NAND gate 300, the gates of n-MOSFETs within the transmission gates T0, T1, . . . Ti, and the gate of n-MOSFET 218. The source of the FET 218 is connected to ground. An output signal $\overline{RREPk}$ of the NAND gate 300 is provided to a decoder corresponding to the redundant decoder circuit 6.

In a semiconductor memory device including a redundant predecoder according to this embodiment, the fuse 206 is cut electrically or by laser when defective cells must be remedied, but the fuse is not cut when there are no defective cells. In the former case, for example, when a defective cell in a main memory cell array, which corresponds to a plurality of row/column addresses 100 . . . 0 is replaced with a redundant cell, among the fuses (f0, f0'), (f1, f1'), (f2, f2'), . . . (fi, fi'), the fuses f0, f1, f2, . . . fi are cut, but in the latter case, the fuses f1', f1, f2, . . . fi are not cut. The chip selecting signal CS is inactivated and maintained at a low level (logical 'zero') when the memory chip is in a standby state, and it is activated and maintained at a high level (logical 'one') when the chip is in an active state.

The operation of a semiconductor memory device according to this embodiment of the present will be described hereinafter.

First, if there is no defective cell in the main cell array according to this embodiment, the chip selecting signal CS is maintained at a low level in the standby state of the memory chip. Hence, the low level voltage on the node 202 is applied to the node 208 through the fuse 206, and is applied to one input terminal of the NAND gate 300. The node 208 goes to the ground voltage through the MOS stack 212 and the n-MOSFET 218. The NAND gate 300 generates the redundancy enable signal $\overline{RREPk}$ at a high level regardless of the voltage levels on the other input terminals 302, 306 thereof, due to the chip selecting signal CS applied to input terminal thereof. The redundant decoder circuit 6 is inactivated by the redundancy enable signal $\overline{RREPk}$ at a high level. Thus, neither redundant word lines nor redundant bit lines are selected. Consequently, at this time, the redundant drive circuit is inactivated. As mentioned above, in the chip standby state, although the fuse 206 of the redundant drive circuit 200 is not cut, static current does not flow at all. Furthermore, since the p-MOSFET Mp1 and the n-MOSFET Mn2 of each the dual inverters DI0–DIi are completely turned off by chip selecting signal CS and its complementary signal $\overline{CS}$, there is no leakage current at all in the defective cell predecoder circuit 100.

On the other hand, when the chip is in the active state, the chip selecting signal CS is activated to a high level. Therefore, a high level voltage is applied to the node 202. The high level voltage on the node 202 is also applied to the node 208 through the fuse 206, and applied to an input terminal 304 of the NAND gate 300. At this time, because the MOS stack 212 has a conductance that allows a current of less than one micro ampere to flow through its current path, the instantaneous impedance of the current path increases so that the node 208 is maintained at a high level. Therefore, the inverter 216 generates a low level output signal. The NAND gate 300 generates the redundancy enable signal $\overline{RREPk}$ at a high level regardless of the voltage levels on the other input terminals 302, 304 thereof, due to the low level signal which is applied to its input terminal 306 from the inverter 216. At this time, the redundancy circuit is thus inactivated.

As described above, when the fuse is not cut since no defective cells exist, MOS stack 212 has a variable impedance which varies with the logical state of the chip selecting signal (that is, it has a low impedance when the chip selecting signal CS is low, but has a high impedance when the chip selecting signal CS is high). Thus, static current does not flow via the MOS stack 212 at all in the standby state, but current of less than only 1 micro ampere flows in the active state. Therefore, compared with the prior art, power dissipation of the redundancy circuit of this embodiment is reduced considerably.

Next, in case at least one defective cell exists in a row/column of a memory chip according to this embodiment, in order to replace the defective cell with the redundant cell, half of the fuses (f0, f0'), (f1, f1'), (f2, f2'), . . . (fi, fi') in the defective cell predecoder 100 corresponding to the redundant cell are cut selectively. At this time, if the value of each address signal RAm (where, m=0, 1, 2, . . . i) of the row/column signals RA0, RA1, . . . RAi corresponding to the defective cell is 0, fuse fm of the corresponding fuse pair is cut, but fuse fm' is cut if the value of each the address signal is 1. For example, when the row/column address signals RA0, RA1, . . . and RAi of the defective cell are 1, 0, 0, . . . and 1, the fuses f0', f1, f2, . . . fi' are cut. With this, the fuses (f0, f0'), (f1, f1'), (f2, f2'), . . . (fi, fi') store the repair address "100 . . . 1". In this case, the fuse 206 of the redundant drive circuit 200 is also cut.

In such a case, for standby state, the node 208 is maintained low by the MOS stack 212, and thus the inverter 216 generates a high level output signal and the chip selecting signal CS is maintained low. Therefore, the NAND gate 300 generates the redundancy enable signal $\overline{RREPk}$ at a high level regardless of the voltage levels on the other input terminals 302 and 306 thereof clue to the chip selecting signal CS and its complementary 20 signal $\overline{CS}$. Consequently, the redundant decoder is inactivated by the redundancy enable signal $\overline{RREPk}$, so any redundant word line or redundant bit line is not selected. At this time, the static current does not flow in the redundant drive circuit 200. Also, since the p-MOSFET Mp1 and the n-MOSFET Mn2 in each dual inverter DI0–DIi is completely turned off, leakage current does not flow in the defective cell predecoder circuit 100.

During the active state, the node 208 is still maintained low by the MOS stack 212, but the chip selecting signal CS is maintained high. Thus, the output signal of the NAND gate 300, namely, the voltage level of the redundancy enable signal $\overline{RREPk}$ is determined by the redundant predecoding signal RPDECm (where, m=0, 1, 2, . . . or i) which is applied to the input terminal 302. At this time, the gates T0, T1, T2, . . . Ti transfer the address signal on the corresponding address input terminal INm to the corresponding fuse fm. The p-MOSFET Mp1 and n-MOSFET Mn2 in each dual inverter DI0-DIi are turned on by the chip selecting signal CS and its complementary signal $\overline{CS}$. Herein, it is supposed that the fuses f0, f0, f1, f1, f2, f2, . . . fi, fi store the repair address of '100 . . . 1'. In this case, the fuses f0', f1, f2, . . . i' are cut. Thus, when the Row/column address RA0, RA1, . . . RAi of 100 . . . 1 are respectively applied to input terminals IN0, IN1, . . . INi, that is, when the row/column address is identical to the repair address, the redundant predecoding signal RPDEC0–RPDECi are driven to high levels and applied to the input terminals 302-0 to 302-i of the NAND gate 300, respectively. Therefore, the NAND gate 300 generates the redundancy enable signal $\overline{RREPk}$ at a low level. This makes activates the redundancy circuit so that the defective cell is replaced by a redundant cell. On the other hand, when the row/column address is not identical to the repair address, at least one of redundant predecoding signals is low. Therefore, the NAND gate 300 generates the redundancy enable signal $\overline{RREPk}$ at a high level so that the redundancy circuit is inactivated.

As described above, according to the present invention, when there is no defective cell, static current does not flow in a standby state, but current of only less than 1 micro ampere flows in the active state. Therefore, compared with the prior art, the power dissipation of the redundancy circuit of this invention is considerably reduced.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A semiconductor memory device with a redundancy circuit for replacing a defective cell with a redundant cell, said device comprising;

a first node for receiving a chip selecting signal;

a second node;

a first inverter having an input terminal connected to the first node;

a fuse connected between the first and the second node;

a first current path connected between the second node and a ground, wherein current of less than several micro amperes flows through the first current path;

a second inverter having an input terminal connected to the second node;

means having a circuit for storing a repair address used to replace the defective cell with the redundant cell and an address input terminal for receiving a row/column address, for generating a redundant predecoding signal indicating whether the row/column address is identical to the repair address; and means having a plurality of input terminals for receiving the chip selecting signal, an output signal of the second inverter and the redundant predecoding signals, respectively, for generating a redundancy enable signal in accordance with a logical combination of the signals applied through the input terminals, wherein the redundancy circuit is activated in accordance with the redundancy enable signal.

2. The semiconductor memory device according to claim 1, wherein the current path is formed by a plurality of MOSFETs connected in series between the second node and the ground.

3. The semiconductor memory device according to claim 1, wherein the current which flows through the current path has an amount of less than one micro ampere.

4. The semiconductor memory device according to claim 1, wherein said means for generating the redundant predecoding signals comprises:

a plurality of fuse pairs, each having two fuses wherein a first end of each of the two fuses is commonly connected to a corresponding input terminal of the means for generating the redundancy enable signal;

a plurality of transmission gates, each connected between a second end of a first one of the two fuses and a corresponding address input terminal;

each of the transmission gates operating responsive to at least one of the input and output signals of the second inverter, for transferring the row/column address corresponding to the address input terminal to the fuse that is connected to a corresponding transmission gate; and a plurality of dual inverters, each connected between a second end of a second one of the two fuses and the corresponding address input terminal and controlled by the chip selecting signal.

5. The semiconductor memory device according to claim 4, wherein each of said dual inverters comprises:

first and second MOSFETs of a first channel type, having their respective current paths thereof connected in series between a power supply node and a corresponding fuse, a gate of the first MOSFET receiving a complementary signal of the chip selecting signal, and a gate of the second MOSFET connected to a corresponding one of the address input terminals; and third and fourth MOSFETs of a second channel type, having their respective current paths thereof connected in series between the corresponding fuse and the ground, a gate of the third MOSFET connected to the corresponding address input terminal, and a gate of the fourth MOSFET receiving the chip selecting signal.

6. A semiconductor memory device with a redundancy circuit for replacing a defective cell with a redundant cell comprising:

a first inverter having an input terminal for receiving a chip selecting signal;

a fuse having a first terminal for receiving the chip selecting signal and a second terminal;

a variable impedance means connected between the second terminal of the fuse and a ground, having a variable impedance that changes according to the chip selecting signal;

wherein the variable impedance means provides a first voltage to the second terminal of the fuse when the chip selecting signal is inactivated, and provides a second level voltage to the second terminal of the fuse when the chip selecting signal is activated;

a second inverter having an input terminal connected to the second terminal of the fuse;

means, having a circuit for storing a repair address used to remedy the defective cell and having an input terminal for receiving a row/column address, for generating a redundant predecoding signal indicating whether the row/column address is identical to the repair address; and means for receiving the chip selecting signal, an output signal of the second inverter, and the redundant predecoding signal, for generating a redundancy enable signal according to a logical combination of the signals received, wherein the redundancy circuit is activated in response to the redundancy enable signal.

7. The semiconductor memory device according to claim 6, wherein said variable impedance means comprises a plurality of MOSFETs connected in series between the input terminal of the second inverter and the ground.

* * * * *

UNITED STATES PATENT AND TRADEMARK OFFICE
CERTIFICATE OF CORRECTION

PATENT NO. : 5,959,907  
DATED : September 28, 1999  
INVENTOR(S) : Kim et al.

Page 1 of 1

It is certified that error appears in the above-identified patent and that said Letters Patent is hereby corrected as shown below:

Column 4,  
Line 43, "fo" should read -- f0 --.

Column 5,  
Line 19, "f1', f1, f2" should read -- f0', f1, f2 --.

Column 6,  
Line 35, "clue" should read -- due --.  
Line 58, "i'" should read -- fi' --.  
Line 62, "RPDECO" should read -- RPDEC0 --.

Signed and Sealed this

Seventh Day of May, 2002

Attest:

Attesting Officer

JAMES E. ROGAN  
Director of the United States Patent and Trademark Office